US010964243B2

(12) United States Patent
Yuan et al.

(10) Patent No.: US 10,964,243 B2
(45) Date of Patent: Mar. 30, 2021

(54) SHIFT REGISTER CIRCUIT AND ITS DRIVING METHOD, GATE DRIVING CIRCUIT AND ITS DRIVING METHOD, AND DISPLAY DEVICE

(71) Applicant: BOE Technology Group Co., Ltd., Beijing (CN)

(72) Inventors: Lijun Yuan, Beijing (CN); Xing Yao, Beijing (CN); Guangliang Shang, Beijing (CN); Haoliang Zheng, Beijing (CN); Zhenyu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 116 days.

(21) Appl. No.: 16/515,880

(22) Filed: Jul. 18, 2019

(65) Prior Publication Data

US 2020/0219428 A1    Jul. 9, 2020

(30) Foreign Application Priority Data

Jan. 4, 2019    (CN) .......................... 201910007786.2

(51) Int. Cl.
*G11C 19/00* (2006.01)
*G09G 3/20* (2006.01)
*G09G 3/36* (2006.01)
*G11C 19/28* (2006.01)

(52) U.S. Cl.
CPC ............. *G09G 3/20* (2013.01); *G09G 3/3677* (2013.01); *G11C 19/28* (2013.01); *G11C 19/287* (2013.01); *G09G 2310/0286* (2013.01)

(58) Field of Classification Search
None
See application file for complete search history.

(56) References Cited

U.S. PATENT DOCUMENTS

| 2017/0330526 A1* | 11/2017 | Fan ....................... G09G 3/3677 |
| 2018/0293952 A1* | 10/2018 | He ........................ G11C 19/28 |
| 2019/0108809 A1* | 4/2019  | Zheng ................... G11C 19/287 |
| 2019/0206294 A1* | 7/2019  | Tian ....................... G09G 3/20 |
| 2020/0020266 A1* | 1/2020  | Feng ...................... G09G 3/20 |
| 2020/0135287 A1* | 4/2020  | Han ...................... G09G 3/3677 |

* cited by examiner

*Primary Examiner* — Tuan T Lam
(74) *Attorney, Agent, or Firm* — Muncy, Geissler, Olds and Lowe, P.C.

(57) ABSTRACT

A shift register circuit according to an embodiment of the present disclosure includes an input sub-circuit and N-stage output sub-circuits. The input sub-circuit is configured to transmit an input signal to a pull up node at a first stage. The output sub-circuit at each stage is configured to transmit a clock signal from a clock signal terminal at a same stage to an output signal terminal at the same stage under the control of a pull-up node at the same stage. The output sub-circuit at each stage is further configured to transmit a signal transmitted to an output signal terminal at the same stage to a pull-up node at an immediately subsequent stage under the control of a shift control signal from a shift control signal terminal at the same stage.

20 Claims, 10 Drawing Sheets

SHIFT REGISTER CIRCUIT AND ITS DRIVING METHOD, GATE DRIVING CIRCUIT AND ITS DRIVING METHOD, AND DISPLAY DEVICE

CROSS-REFERENCE TO RELATED APPLICATION

This application claims a priority to Chinese Patent Application No. 201910007786.2 filed on Jan. 4, 2019, the disclosure of which is incorporated in its entirety by reference herein.

TECHNICAL FIELD

The present disclosure relates to the field of display technology, and in particular to a shift register circuit, a method for driving the shift register circuit, a gate driving circuit, a method for driving the gate driving circuit, and a display device.

BACKGROUND

A Gate Driver On Array (GOA) circuit includes a plurality of shift register circuits connected in cascade, in which the shift register circuit at each stage controls a row of gate lines. However, such a GOA circuit takes up a relatively large space, especially for small-sized panel products or high-resolution panel products, which affects the implementation of narrow borders.

SUMMARY

In a first aspect, embodiments of the present disclosure provide a shift register circuit, including: an input sub-circuit, electrically coupled to an input signal terminal and a pull-up node at a first stage, and configured to transmit an input signal from the input signal terminal to the pull-up node at the first stage; and output sub-circuits at first to $N^{th}$ stages. An output sub-circuit at each stage of the output sub-circuits at the first to $N^{th}$ stages is electrically coupled to a clock signal terminal at a corresponding stage of clock signal terminals at first to $N^{th}$ stages, to a pull-up node at a corresponding stage of pull-up nodes at the first to $N^{th}$ stages, to an output signal terminal at a corresponding stage of output signal terminals at first to $N^{th}$ stages, and to a shift control signal terminal at a corresponding stage of shift control signal terminals at first to $N^{th}$ stages, an output sub-circuit at each stage of the output sub-circuits at the first to $(N-1)^{th}$ stages being electrically coupled to a pull-up node at an immediately subsequent stage, where N is an integer greater than 1. An output sub-circuit at each stage of the output sub-circuits at the first to $N^{th}$ stages is configured to transmit a clock signal from a clock signal terminal at a same stage to an output signal terminal at the same stage under the control of the pull-up node at the same stage. An output sub-circuit at each stage of the output sub-circuits at the first to $(N-1)^{th}$ stages is further configured to, under a shift control signal from a shift control signal terminal at the same stage, transmit a signal from the output signal terminal at the same stage to a pull-up node at an immediately subsequent stage.

According to some possible embodiments of the present disclosure, the shift register circuit further includes pull-down sub-circuits at first to $N^{th}$ stages, which are electrically coupled in a one-to-one correspondence to the output sub-circuits at the first to $N^{th}$ stages. A pull-down sub-circuit at each stage of the pull-down sub-circuits at the first to $N^{th}$ stages is electrically coupled to a pull-down node, a first constant voltage signal terminal and an output signal terminal at a same stage, and configured to transmit a signal from the first constant voltage signal terminal to a signal output terminal at the same stage and the output sub-circuit at the same stage under the control of the pull-down node.

According to some possible embodiments of the present disclosure, the shift register circuit further includes a control sub-circuit, which is electrically coupled to the first constant voltage signal terminal, a second constant voltage signal terminal, the pull-up node at the first stage, and the pull-down node. The control sub-circuit is configured to transmit a signal from the first constant voltage signal terminal or from the second constant voltage signal terminal to the pull-down node under the control of the pull-up node at the first stage.

According to some possible embodiments of the present disclosure, the shift register circuit further includes a reset sub-circuit, which is electrically coupled to a reset signal terminal, the first constant voltage signal terminal, and the pull-up node at the first stage. The reset sub-circuit is configured to transmit, under the control of a signal from the reset signal terminal, a signal from the first constant voltage signal terminal to the pull-up node at the first stage to reset the pull-up node at the first stage.

According to some possible embodiments of the present disclosure, an output sub-circuit at each stage includes an output transistor, a shift transistor, and a storage capacitor, wherein a control electrode of the output transistor is electrically coupled to a pull-up node at a same stage, a first electrode of the output transistor is electrically coupled to a clock signal terminal at the same stage, and a second electrode of the output transistor is electrically coupled to an output signal terminal at the same stage; a control electrode of the shift transistor is electrically coupled to a shift control signal terminal at the same stage, a first electrode of the shift transistor is electrically coupled to an output signal terminal at the same stage, and a second electrode of the shift transistor is electrically coupled to a pull-up node at an immediately subsequent stage; and a first electrode of the storage capacitor is electrically coupled to a pull-up node at the same stage, and a second electrode of the storage capacitor is electrically coupled to a shift output signal terminal at the same stage.

According to some possible embodiments of the present disclosure, a pull-down sub-circuit at each stage includes a pull-down transistor and a shift pull-down transistor, wherein a control electrode of the pull-down transistor is electrically coupled to the pull-down node, a first electrode of the pull-down transistor is electrically coupled to the first constant voltage signal terminal, and a second electrode of the pull-down transistor is electrically coupled to an output signal terminal at the same stage; and a control electrode of the shift pull-down transistor is electrically coupled to the pull-down node, a first electrode of the shift pull-down transistor is electrically coupled to the first constant voltage signal terminal, and a second electrode of the shift pull-down transistor is electrically coupled to an output sub-circuit at the same stage.

According to some possible embodiments of the present disclosure, the input sub-circuit includes a first transistor, wherein a control electrode and a first electrode of the first transistor is electrically coupled to the input signal terminal, and a second electrode of the first transistor is electrically coupled to the pull-up node at the first stage.

According to some possible embodiments of the present disclosure, the control sub-circuit includes a second transistor, a third transistor, a fourth transistor, and a fifth transistor, wherein a control electrode and a first electrode of the second transistor are electrically coupled to the second constant voltage signal terminal, and a second electrode of the second transistor is electrically coupled to a control electrode of the third transistor; a first electrode of the third transistor is electrically coupled to the second constant voltage signal terminal, and a second electrode of the third transistor is electrically coupled to the pull-down node; a control electrode of the fourth transistor is electrically coupled to the pull-up node at the first stage, a first electrode of the fourth transistor is electrically coupled to the first constant voltage signal terminal, and a second electrode of the fourth transistor is electrically coupled to the control electrode of the third transistor; and a control electrode of the fifth transistor is electrically coupled to the pull-up node at the first stage, a first electrode of the fifth transistor is electrically coupled to the first constant voltage signal terminal, and a second electrode of the fifth transistor is electrically coupled to the pull down node.

According to some possible embodiments of the present disclosure, the control sub-circuit further includes a sixth transistor, wherein a control electrode of the sixth transistor is electrically coupled to the pull-down node, a first electrode of the sixth transistor is electrically coupled to the first constant voltage signal terminal, and a second electrode of the sixth transistor is electrically coupled to the pull-up node at the first stage.

According to some possible embodiments of the present disclosure, the reset sub-circuit includes a seventh transistor, wherein a control electrode of the seventh transistor is electrically coupled to the reset signal terminal, a first electrode of the seventh transistor is electrically coupled to the first constant voltage signal terminal, and a second electrode of the seventh transistor is electrically coupled to the pull-up node at the first stage.

In a second aspect, embodiments of the present disclosure further provide a method for driving a shift register circuit as described in the first aspect. The method includes: during an input period, charging the pull-up node at the first stage to a first active level through the input sub-circuit; during an output period, pulling up pull-up nodes at the first to $N^{th}$ stages in response to clock signals from the clock signal terminals at the first to $N^{th}$ stages under the control of shift control signals from the shift control signal terminals at the first to $N^{th}$ stages, respectively, and outputting, from the output signal terminals at the first to $N^{th}$ stages, clock signals from the clock signal terminals at the first to $N^{th}$ stages, respectively; and during a reset period, resetting the pull-up node at the first stage to an inactive level in response to a signal from a first constant voltage signal terminal under the control of a signal from a reset signal terminal.

According to some possible embodiments of the present disclosure, a shift control signal from the shift control terminal at each stage of the shift control signal terminals at the first to $N^{th}$ stages has a first edge, which is prior to a first edge of a clock signal from a clock signal terminal at a same stage, and a second edge, which follows the first edge of the clock signal from the clock signal terminal at the same stage and is prior to a first edge of a clock signal from a clock signal terminal at an immediately subsequent stage.

In a third aspect, embodiments of the present disclosure further provides a gate driving circuit, including a plurality of cascaded shift register circuits, each of the shift register circuits being a shift register circuit as described in the first aspect. The gate driving circuit is coupled to 2K clock signal lines, which are sequentially and cyclically coupled to clock signal terminals of a shift register circuit at each stage of the plurality of cascaded shift register circuits to supply a first to a corresponding one of 2K clock signals to output sub-circuits in a shift register circuit at each stage, where K is a positive integer and N is less than or equal to K+1. A shift register circuit at each stage is electrically coupled to an output signal terminal selected from N output signal terminals of a shift register circuit at one subsequent stage to make an output signal from the selected output signal terminal used as a reset signal.

According to some possible embodiments of the present disclosure, the selected output signal terminal is selected based on a criterion that the output signal of the selected output signal terminal has a first edge, which is not earlier than a second edge of a clock signal of a $N^{th}$ clock signal terminal in the shift register circuit, and a second edge, which is not later than a first edge of a next cycle of a clock signal of the first clock signal terminal in the shift register circuit.

According to some possible embodiments of the present disclosure, the input signal terminal of the shift register circuit at the first stage is configured to receive a frame start signal from outside, and an input signal terminal of a shift register circuit at each stage except for the first stage is electrically coupled to a $N^{th}$ output signal terminal of a shift register circuit at an immediately preceding stage to make an output signal outputted from the $N^{th}$ output signal terminal as an input signal.

According to some possible embodiments of the present disclosure, the gate driving circuit is a Gate Driver On Array (GOA) circuit.

In a fourth aspect, embodiments of the present disclosure further provide a method for driving a gate driving circuit as described in the third aspect, including: supplying a frame start signal to the input signal terminal of a shift register circuit at a first stage; and supplying clock signals to clock signal terminals in shift register circuits at respective stages through the 2K clock signal lines, wherein a clock signal supplied by a first clock signal line of the 2K clock signal lines has a first edge in a first cycle, which lags by ½K of one clock cycle behind a first edge of the frame start signal.

According to some possible embodiments of the present disclosure, the first to $(2K)^{th}$ clock signals have a duty cycle of 50%, and lag sequentially by ½K of one clock cycle.

In a fourth aspect, embodiments of the present disclosure further provide a display device including a gate driving circuit as described in the third aspect.

According to some possible embodiments of the present disclosure, the gate driving circuit is a Gate Driver On Array (GOA) circuit.

BRIEF DESCRIPTION OF THE DRAWINGS

In order to illustrate the embodiments of the present disclosure or technical solutions in related art more clearly, drawings required to be used in the description of the embodiments will be briefly described below. Obviously, the drawings in the following description relate merely to some embodiments of the present disclosure, and based on these drawings, other drawings can be obtained by those skilled in the art without inventive efforts.

DETAILED DESCRIPTION

Figure 1:
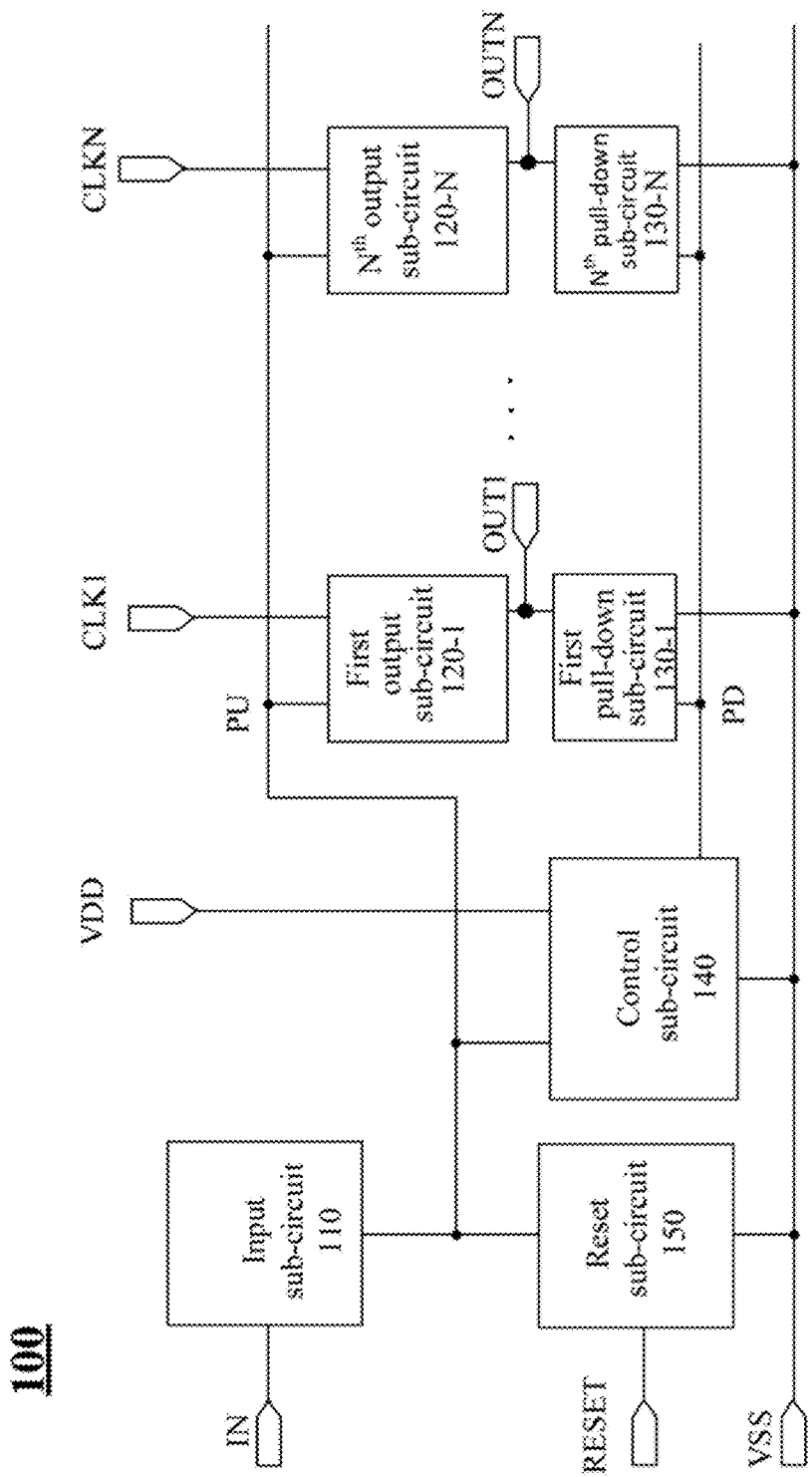
FIG. 1 shows a block diagram of a structure of a multi-output shift register circuit in accordance with an embodiment of the present disclosure.

To make the object, technical solutions and advantages of the present disclosure more apparent, the technical solutions in the embodiments of the present disclosure will be clearly and completely described below in conjunction with the drawings in the embodiments of the present disclosure. Obviously, the following embodiments are only some, rather than all, of the embodiments of the present disclosure. Based on the described embodiments of the present disclosure, all the other embodiments obtained by a person having ordinary skills in the art without any creative effort fall within the scope of protection of the present disclosure. It should be noted that same elements are denoted by same or similar reference signs throughout the drawings. In the following description, some specific embodiments are for illustrative purposes only, and not to be construed as limiting the present disclosure, but are merely examples of the embodiments of the present disclosure. A conventional structure or configuration will be omitted when it obscures the understanding of the present disclosure. It should be noted that shapes and sizes of various components in the drawings do not reflect true sizes and proportions, but merely illustrate the contents of the embodiments of the present disclosure.

Unless otherwise defined, technical or scientific terms used in the embodiments of the present disclosure should have the same meaning as commonly understood by those skilled in the art to which the present disclosure pertains. Terms such as "first", "second" and the like used in the embodiments of the present disclosure are used merely to distinguish different constituent components rather than to indicate any sequence, number or importance.

In addition, in the description of the embodiments of the present disclosure, such a term as "coupled" or "electrically coupled" can mean that two components are directly coupled or electrically coupled, or that two components are coupled or electrically coupled via one or more other components. Furthermore, the two components can be coupled or electrically coupled by wire or wirelessly. Hereinafter, when referring to "A and B are coupled", a case where "A and B are electrically coupled" is included and a case where "A and B are coupled by other means" is also included.

Transistors used in the embodiments of the present disclosure can each be a thin film transistor or a field effect transistor or another device having the same characteristics. The transistors used in the embodiments of the present disclosure are mainly switching transistors depending on their functions in a circuit. The transistor used in the present disclosure includes "a control electrode", "a first electrode" and "a second electrode". In an embodiment using a thin film transistor, the control electrode refers to a gate electrode of the thin film transistor, the first electrode refers to one of a source electrode and a drain electrode of the thin film transistor, and the second electrode refers to the other one of the source electrode and the drain electrode of the thin film transistor. Since the source and drain electrodes of the thin film transistor used herein are symmetrical, the source and the drain electrodes thereof are interchangeable. An N-type thin film transistor is described as an example in the following embodiments. Similarly, in other embodiments, the technical solution of the present disclosure can instead be implemented with a P-type thin film transistor. Those skilled in the art will appreciate that in this case, the technical solution of the present disclosure can also be implemented by inverting (and/or making other adaptive modifications to) an input signal, a reset signal, a clock signal, and a constant voltage signal, and the like.

In an embodiment of the present disclosure, a clock signal is a cyclic signal. In one cycle, the clock signal is divided into a high level period and a low level period, which appear successively, by two signal edges (a first edge and a second edge that lags behind the first edge). Further, in the description of the embodiments of the present disclosure, terms "active level" and "inactive level" are levels at which a relevant transistor is turned "ON" and "OFF", respectively. In the present disclosure, a "first active level" and a "second active level" are only used to indicate magnitudes of the two active levels are different. Hereinafter, since an N-type thin film transistor is employed as an example, the "active level" is a high level and the "inactive level" is a low level.

Accordingly, hereinafter, since an N-type thin film transistor is employed as an example, a signal supplied from a "first constant voltage signal terminal" for supplying an inactive driving level is a low level signal vgl, and a signal supplied from a "second constant voltage signal terminal" for supplying an active level is a high level signal vgh. Without loss of generality, in the following, high levels of an input signal and a clock signal which can be switched between a high level and a low level are also set to vgh and low levels thereof are set to vgl for convenience of explanation. It should be understood by those skilled in the art that in some embodiments, high levels of signals can be different from each other, and low levels of signals can also be different from each other.

Hereinafter, for convenience of explanation, uppercases are used to indicate signal lines or terminals for receiving or transmitting signals, and lowercases are used to identify signals received or transmitted by corresponding signal lines or terminals. For example, CLK1 represents a clock signal terminal at a first stage, and clk1 represents a first clock signal from the clock signal terminal at the first stage.

The present disclosure is specifically described below with reference to the accompanying drawings.

FIG. 1 shows an exemplary block diagram of a structure of a multi-output shift register circuit 100 in accordance with an embodiment of the present disclosure.

As seen from FIG. 1, the shift register circuit 100 includes an input sub-circuit 110 and output sub-circuits at first to $N^{th}$ stages 120-1 to 120-N. The input sub-circuit 110 is coupled to an input signal terminal IN and a pull-up node PU, and configured to transmit an input signal from the input signal terminal IN to the pull-up node PU.

An output sub-circuit at each stage of the output sub-circuits at the first to $N^{th}$ stages 120-1 to 120-N is electrically coupled to the pull-up node PU, to a clock signal terminal at a corresponding stage of clock signal terminals at first to $N^{th}$ stages CLK1 to CLKN, and to an output signal terminal at a corresponding stage of output signal terminals at first to $N^{th}$ stages OUT1 to OUTN.

An output sub-circuit at each stage of the output sub-circuits at the first to $N^{th}$ stages 120-1 to 120-N is configured to transmit a clock signal from a clock signal terminal at a same stage to an output signal terminal at the same stage under the control of a voltage of the pull-up node PU.

The shift register circuit 100 further includes pull-down sub-circuits at first to $N^{th}$ stages 130-1 to 130-N.

The pull-down sub-circuits at the first to $N^{th}$ stages 130-1 to 130-N are in a one-to-one correspondence with the output sub-circuits at the first to $N^{th}$ stages 120-1 to 120-N. Specifically, a pull-down sub-circuit at each stage of the pull-down sub-circuits at the first to $N^{th}$ stages 130-1 to 130-N is electrically coupled to a pull-down node PD and a first constant voltage signal terminal VSS, and further to an output signal terminal at a same stage. A pull-down sub-circuit at each stage is configured to transmit a signal from the first constant voltage signal terminal VSS to an output signal terminal at a same stage under the control of a voltage of the pull-down node PD to pull it down to a level of the signal of the VSS.

As a non-limiting example, the shift register circuit 100 further includes, for example, a control sub-circuit 140 and a reset sub-circuit 150.

Specifically, the control sub-circuit 140 is electrically coupled to the first constant voltage signal terminal VSS, a second constant voltage signal terminal VDD, the pull-up node PU, and the pull-down node PD. The control sub-circuit 140 is configured to transmit a signal from the first constant voltage signal terminal VSS or from the second constant voltage signal terminal VDD to the pull-down node PD under the control of a voltage of the pull-up node PU.

The reset sub-circuit 150 is electrically coupled to a reset signal terminal RESET, the first constant voltage signal terminal VSS, and the pull-up node PU. The reset sub-circuit 150 is configured to transmit a signal from the first constant voltage signal terminal VDD to the pull-up node PU under the control of a signal from the reset signal terminal RESET to reset the pull-up node PU.

Figure 2:
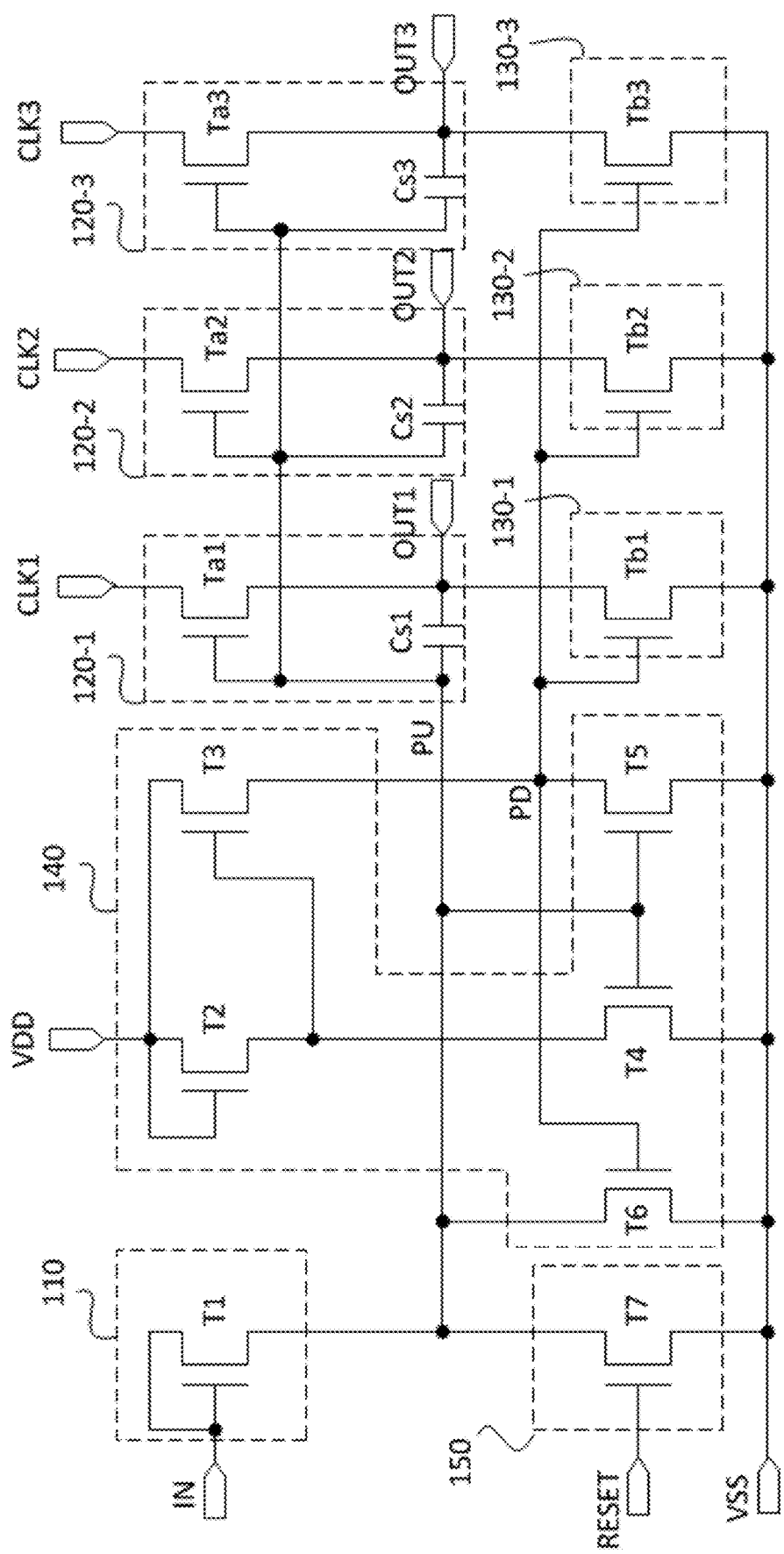
FIG. 2 shows an exemplary circuit diagram of the shift register circuit shown in FIG. 1.

FIG. 2 shows an exemplary circuit diagram of the shift register circuit 100 shown in FIG. 1. For convenience of explanation, FIG. 2 shows only a circuit diagram in the case where N is equal to 3. It should be understood that the present disclosure is not limited thereto, and in other embodiments, N can be any value other than 3 (N is greater than 1). Those skilled in the art will be able to know structure and workflow of the circuit in the case where N is another value based on the following description and explanation.

As shown in FIG. 2, the input sub-circuit 110 includes a first transistor T1. Here, the transistor is, for example, a thin film transistor (TFT), but is not limited thereto. A control electrode and a first electrode of the first transistor T1 are electrically coupled to the input signal terminal IN, and a second electrode of the first transistor T1 is electrically coupled to the pull-up node PU.

An output sub-circuit at each stage of output sub-circuits at the first to third stages 120-1, 120-2 and 120-3 includes an output transistor (Ta1, Ta2, Ta3) and a storage capacitor (Cs1, Cs2, Cs3).

A structure of each output sub-circuit is described with the output sub-circuit at the first stage 120-1 as an example. A control electrode of the output transistor Ta1 is electrically coupled to the pull-up node PU, a first electrode of the output transistor Ta1 is electrically coupled to the clock signal terminal at the first stage CLK1, and a second electrode of the output transistor Ta1 is electrically coupled to the output signal terminal at the first stage OUT1. A first electrode of the storage capacitor Cs1 is electrically coupled to the pull-up node PU, and a second electrode of the storage capacitor Cs1 is electrically coupled to the output signal terminal at the first stage OUT1.

A pull-down sub-circuit at each stage of pull-down sub-circuits at the first to third stages 130-1, 130-2, and 130-3 includes a pull-down transistor (Tb1, Tb2, Tb3).

A structure of each pull-down sub-circuit is described with the pull-down sub-circuit at the first stage 130-1 as an example. A control electrode of the pull-down transistor Tb1 is electrically coupled to the pull-down node PD, a first electrode of the pull-down transistor Tb1 is electrically coupled to the first constant voltage signal terminal VSS, and a second electrode of the pull-down transistor Tb1 is electrically coupled to the output signal terminal at the first stage OUT1.

The control sub-circuit 140 includes, for example, a second transistor T2, a third transistor T3, a fourth transistor T4, and a fifth transistor T5.

A control electrode and a first electrode of the second transistor T2 are both electrically coupled to the second constant voltage signal terminal VDD, and a second electrode of the second transistor T2 is electrically coupled to a control electrode of the third transistor T3. A first electrode of the third transistor T3 is electrically coupled to the second constant voltage signal terminal VDD, and a second electrode of the third transistor T3 is electrically coupled to the pull-down node PD. A control electrode of the fourth transistor T4 is electrically coupled to the pull-up node PU, a first electrode of the fourth transistor T4 is electrically coupled to the first constant voltage signal terminal VSS, and a second electrode of the fourth transistor T4 is electrically coupled to the control electrode of the third transistor T3. A control electrode of the fifth transistor T5 is electrically coupled to the pull-up node PU, a first electrode of the fifth transistor T5 is electrically coupled to the first constant voltage signal terminal VSS, and a second electrode of the fifth transistor T5 is electrically coupled to the pull-down node PD.

In some embodiments, as shown in FIG. 2, the control sub-circuit 140 further includes, for example, a sixth transistor T6.

A control electrode of the sixth transistor T6 is electrically coupled to the pull-down node PD, a first electrode of the sixth transistor T6 is electrically coupled to the first constant voltage signal terminal VSS, and a second electrode of the sixth transistor T6 is electrically coupled to the pull-up node PU.

The reset sub-circuit 150 includes a seventh transistor T7.

A control electrode of the seventh transistor T7 is electrically coupled to the reset signal terminal RESET, a first electrode of the seventh transistor T7 is electrically coupled to the first constant voltage signal terminal VSS, and a second electrode of the seventh transistor T7 is electrically coupled to the pull-up node PU.

Figure 3:
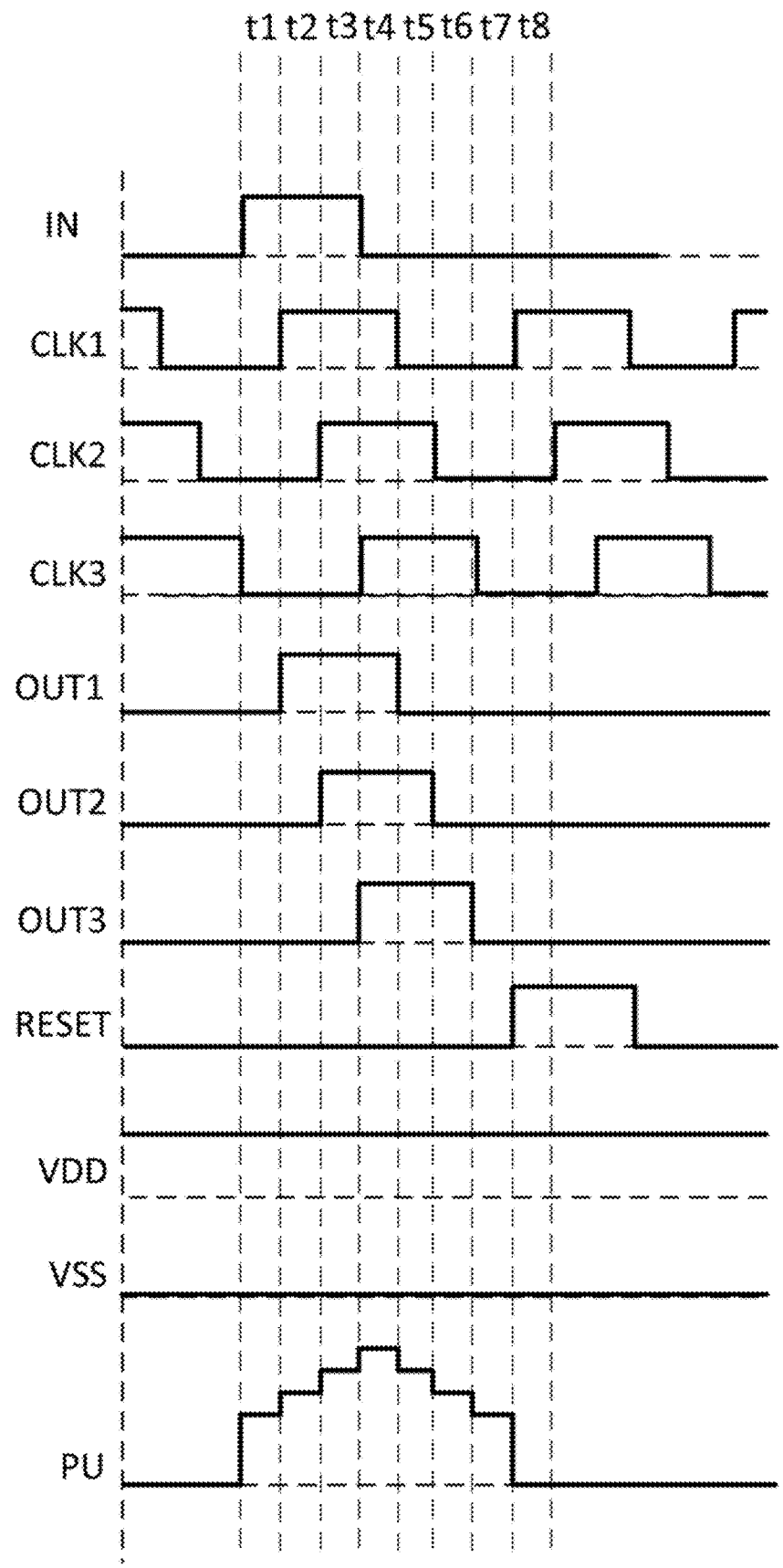
FIG. 3 shows a timing chart of the shift register circuit shown in FIG. 2.

FIG. 3 shows a timing chart of the shift register circuit 100 shown in FIG. 2. An operation flow of the shift register circuit 100 of FIG. 2 will be described below in conjunction with FIG. 3. For convenience of description, it is assumed below that the storage capacitors Cs1, Cs2, and Cs3 have identical capacitance values, which are equal to C. Of course, the capacitance values of the storage capacitors Cs1, Cs2, and Cs3 can be different from each other according to actual needs, and are not limited herein.

According to the timing chart in FIG. 3, one clock cycle is equally divided into six periods, and clock signals of the clock signal terminals at the first to third stages CLK1 to CLK3 lag sequentially by ⅙ of one clock cycle, that is, one period behind. A signal of the input signal terminal IN is ⅙ of one clock cycle earlier than (that is, one period ahead of) the signal of the clock signal terminal at the first stage CLK1.

Prior to a period t1, there is no input signal inputted at the input signal terminal IN of the shift register circuit 100. In other words, the shift register 100 starts operation at the period t1. During the period t1, a signal of the input signal terminal IN changes from a low level vgl to a high level vgh to turn on the first transistor T1, so that a voltage of the pull-up node PU is pulled up to a first active level, i.e., the high level vgh. Under the high level of the PU, the output transistors Ta1, Ta2, and Ta3 are all turned on, but at this time, the clock signal terminals at the first to third stages CLK1, CLK2 and CLK3 continues supplying the low levels vgl. At this time, the output signal terminals OUT1, OUT2, and OUT3 receive low level signals. Moreover, the fourth and fifth transistors T4 and T5 are turned on under the high level of the PU to enable the transmission of a signal vgl from the first constant voltage signal terminal VSS to the second electrode of T2 and the pull-down node PD. On the other hand, the second constant voltage signal terminal VDD supplies a high level vgh so that the second and third transistors T2 and T3 are turned on, so as to enable the supply of high level signals to the second electrode of the second transistor T2 and the pull-down Node PD. In this case, width-to-length ratios of channels of T2 and T4 and of T3 and T5 can be set so that low levels, which are transmitted to the second electrode of T2 and the pull-down node PD via T4 and T5, respectively, cause the second electrode of T2 and the pull-down node PD to be finally at low levels vgl. Further, the low level at the pull-down node PD causes the pull-down transistors Tb1, Tb2, Tb3, and the sixth transistor T6 to be turned off. At this time, the output signal terminals at the first to third stages OUT1 to OUT3 output signals which are all low level signals.

During a period t2, the signal of the clock signal terminal at the first stage CLK1 becomes at a high level, and the signals of the clock signal terminals at the second and third stages CLK2 and CLK3 remain at the low levels. The high level of the signal of the clock signal terminal at the first stage CLK1 causes the output signal terminal at the first stage OUT1 to output a high level signal. Through bootstrapping effect of the storage capacitor Cs1, the voltage of the PU node will be further boosted. Due to the coupling of the storage capacitors Cs2 and Cs3, a voltage boost value Vr1 of the PU node according to the principle of charge conservation satisfies the following formula: vgh×C=Vr1×3C, from which it can be derived that Vr1=1/3 vgh. At this time, the voltage at the PU node is 4/3 vgh. In addition, since the clock signal terminals at the second and third stages CLK2 and CLK3 continue outputting the low level signals, the output signal terminals at the second and third stages OUT2 and OUT3 remain at low levels.

During a period t3, the signal of the clock signal at the first stage CLK1 is at the high level, the signal of the clock signal at the second stage CLK2 becomes at a high level, and the signal of the clock signal terminal at the third stage CLK3 remains at the low level. Similarly to the period t2, since the signal of the CLK2 changes from the low level to the high level, the output of the OUT2 also changes from the low level to the high level. Also under the bootstrapping effect of the storage capacitor Cs2, the voltage at the PU node is further boosted. Similarly, a voltage boost value Vr2 of the PU node in this period is equal to 1/3 vgh. At this time, the voltage at the PU node is 5/3 vgh. Further, since the clock signal terminal at the third stage CLK3 continues outputting the low level signal, the output signal terminal at the third stage OUT3 remains at the low level.

During a period t4, the signal of the clock signal at the first stage CLK1 is at the high level, the signal of the clock signal at the second stage CLK2 is at the high level, and the signal of the clock signal terminal at the third stage CLK3 becomes at a high level. Similarly to the periods t2 and t3, since the signal of the CLK3 also changes from the low level to the high level, the output of the OUT3 changes from the low level to the high level. Also under the bootstrapping effect of the storage capacitor Cs3, the voltage at the PU node is further boosted. Similarly, a voltage boost value Vr3 of the PU node in this period is equal to 1/3 vgh. At this time, the voltage at the PU node is 2 vgh, and the clock signal terminals at the first to third stages CLK1 to CLK3 output signals which are all at high levels.

During a period t5, the signal of the clock signal at the first stage CLK1 becomes at a low level, the signal of the clock signal at the second stage CLK2 is at the high level, and the signal of the clock signal terminal at the third stage CLK3 is at the high level. Since the signal of the CLK1 changes from the high level to the low level, the output of the OUT1 changes from the high level to the low level. Under the bootstrapping effect of the storage capacitor Cs1, the voltage at the PU node drops due to the change in the output of the OUT1. In this period, a voltage drop value Vd1 of the PU node is equal to 1/3 vgh. At this time, the voltage at the PU node is 5/3 vgh. A dropping speed of the output level of the OUT1 is determined by a driving level of the output transistor Ta1, that is, by the voltage of the PU node. However, as described above, the voltage of the PU node also drops from 2vgh down to 5/3vgh during the dropping of the output level of the OUT1. The output level of the OUT1 therefore drops from the high level vgh to the low level vgl under the action of an average driving voltage between 2vgh and 5/3vgh.

During a period t6, the signal of the clock signal terminal at the first stage CLK1 remains at the low level, the signal of the clock signal terminal at the second stage CLK2 becomes at a low level, and the signal of the clock signal terminal at the third stage CLK3 remains at the high level. Since the signal of the CLK2 changes from the high level to the low level, the output of the OUT2 changes from the high level to the low level. Similarly to the period t5, under the bootstrapping effect of the storage capacitor Cs2, the voltage of the PU node drops due to the change in the output of the OUT2. In this period, a voltage drop value Vd2 of the PU node is equal to 1/3 vgh. At this time, the voltage of the PU node is 4/3 vgh. A dropping speed of the output level of the OUT2 is determined by a driving level of the second output transistor Tat, that is, by the voltage of the PU node. However, as described above, the voltage of the PU node drops from 5/3 vgh to 4/3 vgh during the dropping of the output level of the OUT2. The output level of the OUT2 therefore drops form the high level vgh to the low level vgl under the action of an average driving voltage between 5/3 vgh and 4/3 vgh.

During a period t7, the signal of the clock signal terminal at the first stage CLK1 remains at the low level, the signal of the clock signal at the second stage CLK2 remains at the low level, and the signal of the clock signal terminal at the third stage CLK3 becomes at a low level. Since the signal of the CLK3 changes from the high level to the low level, the output of the OUT3 changes from the high level to the low level. Similarly to the periods t5 and t6, under the bootstrapping effect of the storage capacitor Cs3, the voltage of the PU node drops due to the change in the output of the OUT3. In this period, a voltage drop value Vd3 of the PU node is equal to 1/3 vgh. At this time, the voltage of the PU node is vgh. A dropping speed of the output level of the OUT3 is determined by a driving level of the third output transistor Ta3, that is, by the voltage of the PU node. However, as described above, the voltage of the PU node drops from 4/3 vgh down to vgh during the dropping of the output level of the OUT3. The output level of OUT3 therefore drops from the high level vgh to the low level vgl under the action of an average driving voltage between 4/3 vgh and vgh.

During a period t8, the reset signal terminal RESET becomes at a high level, the seventh transistor T7 is turned on, and the pull-up node PU is pulled down to a low level, thereby realizing the reset of the PU node. In this case, the fourth and fifth transistors T4 and T5 are turned off, causing the pull-down node PD to become at a high level in response to the signal of the VDD. Thus, the pull-down transistors Tb1-Tb3 are all turned on, and the signal of VSS is further transmitted to the output signal terminals OUT1-OUT3 to ensure that they output low levels.

As can be seen from the above, during the dropping processes of the output levels of the output signal terminals OUT1, OUT2, and OUT3 from the high level vgh to the low level vgl, the driving voltages of the PU nodes received by the output transistors Ta1, Ta2, and Ta3 are different. Specifically, an average value of the voltage of the PU node in the dropping process of the output level of the OUT1 is between 2vgh and 5/3vgh, an average value of the voltage of the PU node in the dropping process of the output level of the OUT2 is between 5/3vgh and 4/3vgh, and an average value of the voltage of the PU node in the dropping process of the output level of the OUT3 is between 4/3vgh and vgh. As can be seen, during the level dropping process of the last two output signal terminals OUT2 and OUT3, the output transistor is not sufficiently turned on (the driving voltage is less than 2 vgh), and a dropping time is prolonged, which will cause poor display.

Figure 4:
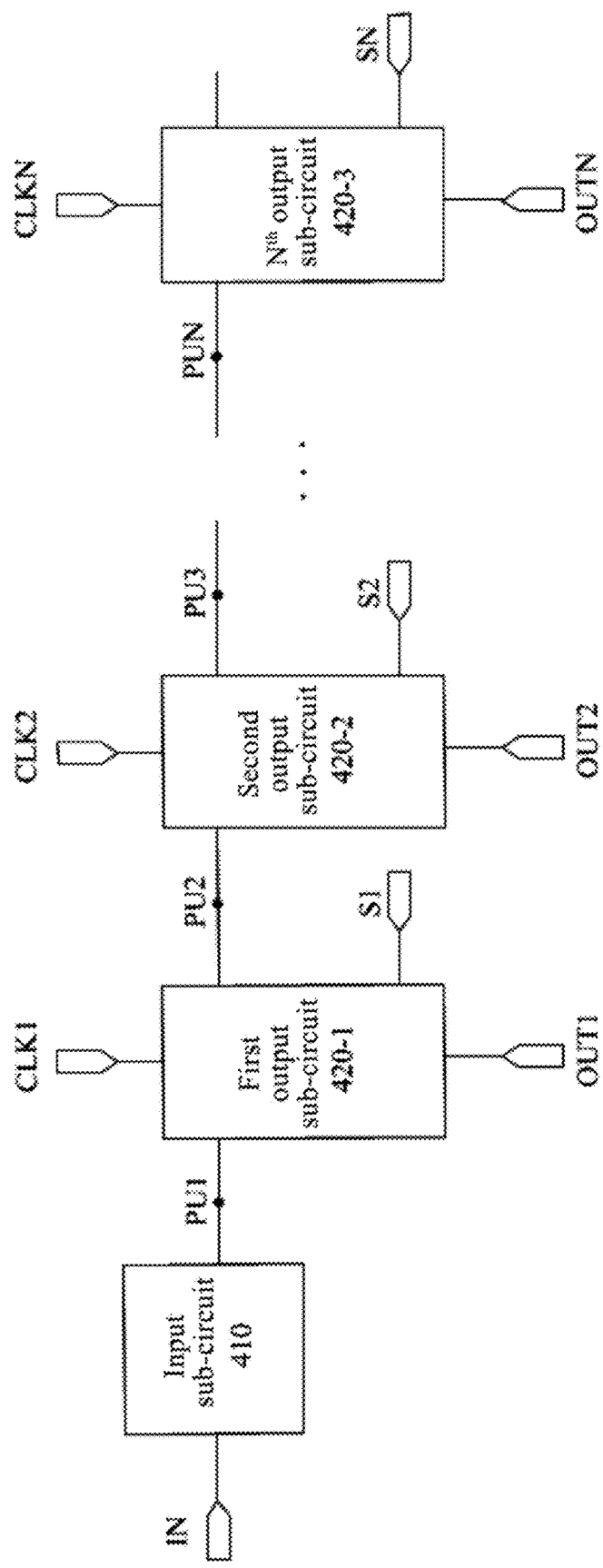
FIG. 4 shows a block diagram of a structure of a multi-output shift register circuit in accordance with an embodiment of the present disclosure.

FIG. 4 shows a block diagram of a structure of a multi-output shift register circuit 400 in accordance with an embodiment of the present disclosure. Unlike the shift register circuit 100 of FIG. 1, each of output sub-circuits in the shift register circuit 400 is coupled to a corresponding one of pull-up nodes PU1 to PUN which are different.

Specifically, as seen in FIG. 4, the shift register circuit 400 includes an input sub-circuit 410 and output sub-circuits at first to $N^{th}$ stages 420-1 to 420-N. The input sub-circuit 410 is coupled to an input signal terminal IN and the pull-up node at the first stage PU1, and is configured to transmit an input signal from the input signal terminal IN to the pull-up node at the first stage PU1.

An output sub-circuit at each stage of the output sub-circuits at the first to $N^{th}$ stages 420-1 to 420-N is electrically coupled to a clock signal terminal at a corresponding stage of clock signal terminals at first to $N^{th}$ stages CLK1 to CLKN, to a pull-up node at a corresponding stage of pull-up nodes at the first to $N^{th}$ stages PU1 to PUN, and to an output signal terminal at a corresponding stage of output signal terminals at first to $N^{th}$ stages OUT1 to OUTN. An output sub-circuit at each stage is configured to transmit, under independent control of a voltage of the pull-up node at a same stage, a clock signal from a clock signal terminal at the same stage to an output signal terminal at the same stage.

In addition, an output sub-circuit at each stage of the output sub-circuits at the first to $N^{th}$ stages 420-1 to 420-N is further electrically coupled to a shift control signal terminal at a corresponding stage of shift control signal terminals at first to $N^{th}$ stages S1 to SN, and an output sub-circuit at each stage of the output sub-circuits at the first to $(N-1)^{th}$ stages 420-1 to 420-(N-1) is electrically coupled to a pull-up node at an immediately subsequent stage. By way of example, the output sub-circuit 420-2 at the second stage is electrically coupled to the pull-up node at the third stage PU3 which corresponds to the output sub-circuit at the third stage 420-3, and so on. An output sub-circuit at each stage is further configured to transmit, under the control of a shift control signal from a shift control signal terminal at a same stage, a signal transmitted to an output signal terminal at the same stage to a pull-up node at an immediately subsequent stage. By way of example, the output sub-circuit at the second stage 420-2 is configured to transmit, under the control of the shift control signal from the shift control signal terminal at the second stage S2, a signal at the output signal terminal at the second stage OUT2 to the pull-up node at the third stage PU3 corresponding to the output sub-circuit at the third stage 420-3.

Figure 5:
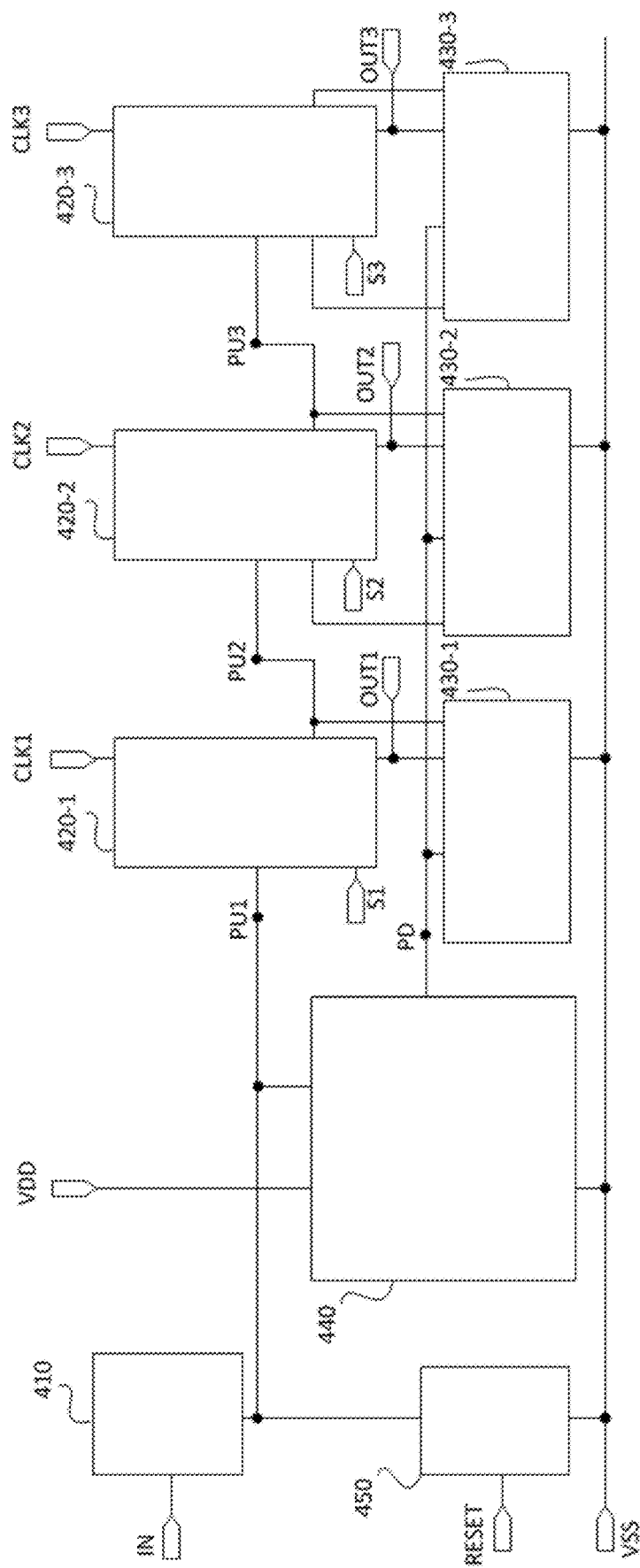
FIG. 5 shows a block diagram of a specific structure of the shift register circuit of FIG. 4.

FIG. 5 shows a block diagram of a specific structure of the shift register circuit 400 of FIG. 4. For convenience of explanation, FIG. 5 shows only the circuit diagram in the case where N is equal to 3. It should be understood that the present disclosure is not limited thereto, and in other embodiments, N can be any value other than 3 (N is greater than 1). Those skilled in the art will be able to know structure and workflow of the circuit in the case where N is another value based on the following description and explanation.

As seen in FIG. 5, the shift register circuit 400 further includes pull-down sub-circuits at first to third stages 430-1 to 430-3.

The pull-down sub-circuits at the first to third stages 430-1 to 430-3 are coupled in a one-to-one correspondence to the output sub-circuits at the first to third stages 420-1 to 420-3. Specifically, a pull-down sub-circuit at each stage of the pull-down sub-circuits at the first to third stages 430-1 to 430-3 is electrically coupled to a pull-down node PD and a first constant voltage signal terminal VSS, and further to an output signal terminal at a same stage and an output sub-circuit at the same stage. A pull-down sub-circuit at each stage of the pull-down sub-circuits at the first to third stages 430-1 to 430-3 is configured to transmit a signal from the first constant voltage signal terminal to an output signal terminal at a same stage and an output sub-circuit at the same stage under the control of a voltage of the pull-down node PD.

As a non-limiting example, the shift register circuit 400 further includes, for example, a control sub-circuit 440 and a reset sub-circuit 450.

Specifically, the control sub-circuit 440 is electrically coupled to the first constant voltage signal terminal VSS, a second constant voltage signal terminal VDD, the pull-up node at the first stage PU1, and the pull-down node PD. The control sub-circuit 440 is configured to transmit a signal from the first constant voltage signal terminal VSS or from the second constant voltage signal terminal VDD to the pull-down node PD under the control of a voltage of the pull-up node at the first stage PU1.

The reset sub-circuit 450 is electrically coupled to a reset signal terminal RESET, the first constant voltage signal terminal VSS, and the pull-up node at the first stage PU1. The reset sub-circuit 450 is configured to transmit a signal from the first constant voltage signal terminal VDD to the pull-up node at the first stage PU1 to reset the pull-up node at the first stage PU1, under the control of a signal from the reset signal terminal RESET.

Figure 6:
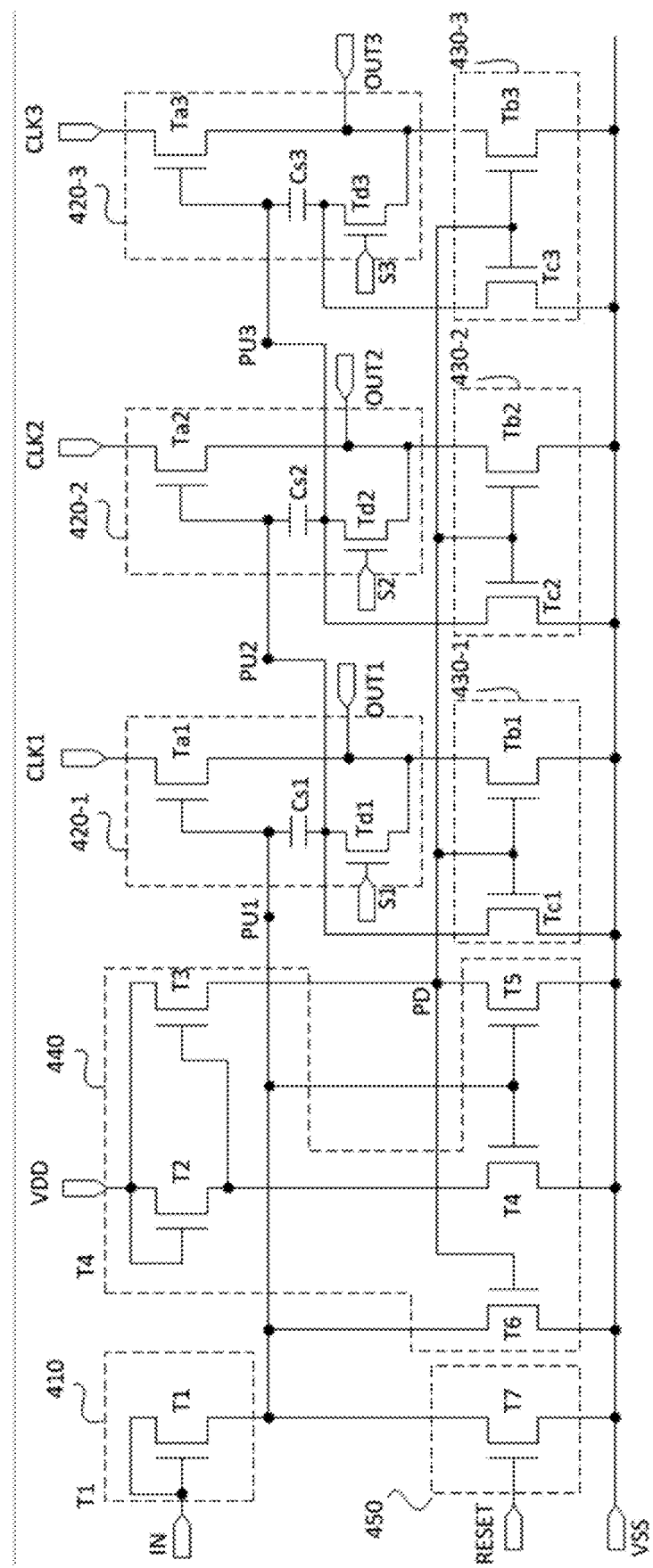
FIG. 6 shows an exemplary circuit diagram of the shift register circuit shown in FIG. 5.

FIG. 6 shows an exemplary circuit diagram of the shift register circuit 400 of FIG. 5.

As shown in FIG. 6, the input sub-circuit 410 includes a first transistor T1. A control electrode and a first electrode of the first transistor T1 are electrically coupled to the input signal terminal IN, and a second electrode of the first transistor T1 is electrically coupled to the pull-up node at the first stage PU1.

An output sub-circuit at each stage of output sub-circuits at the first to third stages 420-1 to 420-3 includes an output transistor (Ta1, Ta2, Ta3), a shift transistor (Td1, Td2, Td3), and a storage capacitor (Cs1, Cs2, Cs3).

A structure of each output sub-circuit is described with the output sub-circuit at the first stage 420-1 as an example. A control electrode of the output transistor Ta1 is electrically coupled to a pull-up node at a same stage (i.e., the pull-up node at the first stage PU1), a first electrode of the output transistor Ta1 is electrically coupled to a clock signal terminal at the same stage (i.e., the clock signal terminal at the first stage CLK1), and a second electrode of the output transistor Ta1 is electrically coupled to an output signal terminal at the same stage (i.e., the output signal terminal at the first stage OUT1). A control electrode of the shift transistor Td1 is electrically coupled to a shift control signal terminal at the same stage (i.e., the shift control signal terminal at the first stage S1), a first electrode of the shift transistor Td1 is electrically coupled to an output signal terminal at the same stage (i.e., the output signal terminal at the first stage OUT1), and a second electrode of the shift transistor Td1 is electrically coupled to a pull-up node at an immediately subsequent stage (i.e., the pull-up node at the second stage PU2). A first electrode of the storage capacitor Cs1 is electrically coupled to a pull-up node at the same stage (i.e., the pull-up node at the first stage PU1), and a second electrode of the storage capacitor Cs1 is electrically coupled to the output signal terminal at the same stage (i.e., the output signal terminal at the first stage OUT1).

A pull-down sub-circuit at each stage of pull-down sub-circuits at the first to third stages 430-1 to 430-3 includes a pull-down transistor (Tb1, Tb2, Tb3) and a shift pull-down transistor (Tc1, Tc2, Tc3).

A structure of each pull-down sub-circuit is described with the pull-down sub-circuit at the first stage 430-1 as an example. A control electrode of the pull-down transistor Tb1 is electrically coupled to the pull-down node PD, a first electrode of the pull-down transistor Tb1 is electrically coupled to the first constant voltage signal terminal VSS, and a second electrode of the pull-down transistor Tb1 is electrically coupled to an output signal terminal at a same stage (i.e., the output signal terminal at the first stage OUT1). A control electrode of the shift pull-down transistor Tc1 is electrically coupled to the pull-down node PD, a first electrode of the shift pull-down transistor Tc1 is electrically coupled to the first constant voltage signal terminal VSS, and a second electrode of the shift pull-down transistor Tc1 is electrically coupled to an output sub-circuit at the same stage (i.e., the output sub-circuit at the same stage 420-1).

The control sub-circuit 440 includes, for example, a second transistor T2, a third transistor T3, a fourth transistor T4, and a fifth transistor T5.

A control electrode and a first electrode of the second transistor T2 are both electrically coupled to the second constant voltage signal terminal VDD, and a second electrode of the second transistor T2 is electrically coupled to a control electrode of the third transistor T3. A first electrode of the third transistor T3 is electrically coupled to the second constant voltage signal terminal VDD, and a second electrode of the third transistor T3 is electrically coupled to the pull-down node PD. A control electrode of the fourth transistor T4 is electrically coupled to the pull-up node at the first stage PU1, a first electrode of the fourth transistor T4 is electrically coupled to the first constant voltage signal terminal VSS, and a second electrode of the fourth transistor T4 is electrically coupled to the control electrode of the third transistor T3. A control electrode of the fifth transistor T5 is electrically coupled to the pull-up node at the first stage PU1, a first electrode of the fifth transistor T5 is electrically coupled to the first constant voltage signal terminal VSS, and a second electrode of the fifth transistor T5 is electrically coupled to the pull-down node PD.

In some embodiments, as shown in FIG. 2, the control sub-circuit 440 further includes, for example, a sixth transistor T6.

A control electrode of the sixth transistor T6 is electrically coupled to the pull-down node PD, a first electrode of the sixth transistor T6 is electrically coupled to the first constant voltage signal terminal VSS, and a second electrode of the sixth transistor T6 is electrically coupled to the pull-up node at the first stage PU1.

The reset sub-circuit 450 includes, for example, a seventh transistor T7.

A control electrode of the seventh transistor T7 is electrically coupled to the reset signal terminal RESET, a first electrode of the seventh transistor T7 is electrically coupled to the first constant voltage signal terminal VSS, and a second electrode of the seventh transistor T7 is electrically coupled to the pull-up node at the first stage PU1.

Figure 7:
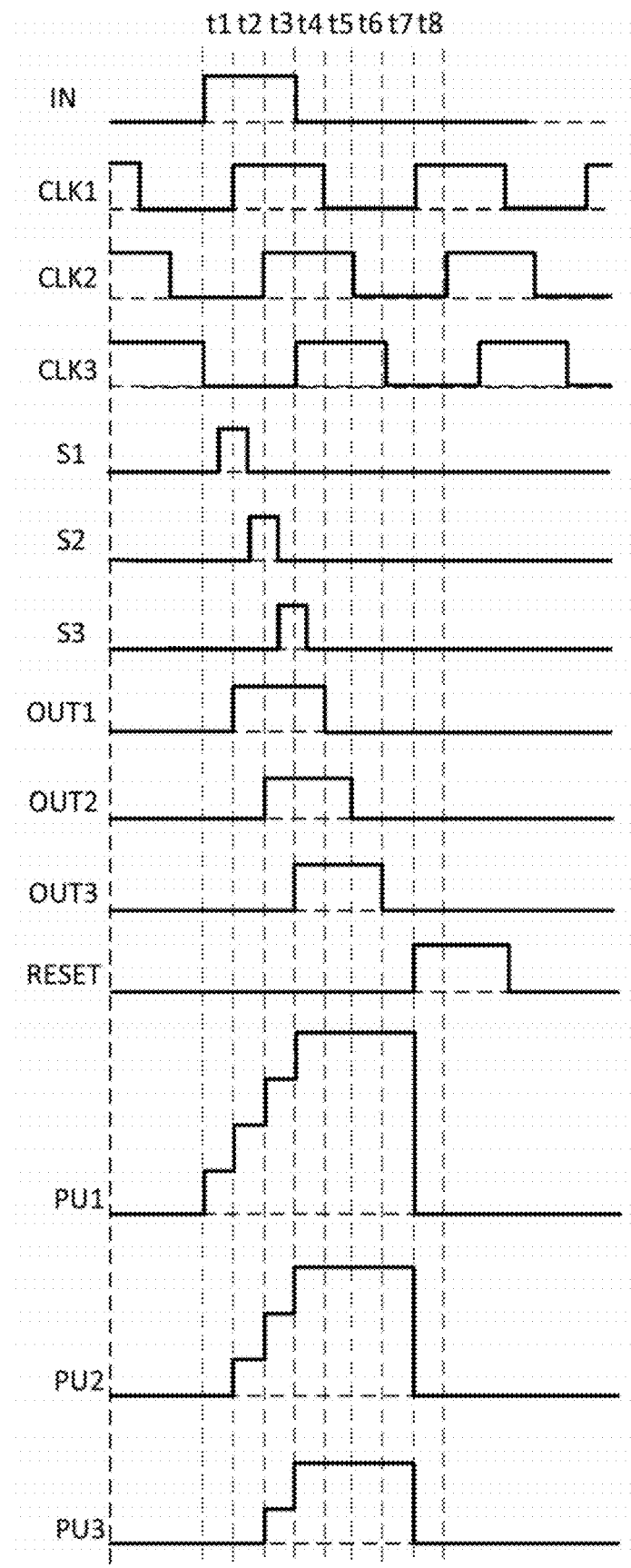
FIG. 7 shows a timing chart of the shift register circuit shown in FIG. 6.

FIG. 7 shows a timing chart of the shift register circuit 400 shown in FIG. 6. An operation flow of the shift register circuit 400 in FIG. 6 will be described below in conjunction with FIG. 7. For convenience of description, it is assumed below that the storage capacitors Cs1, Cs2, and Cs3 have identical capacitance values, which are equal to C. Of course, the capacitance values of the storage capacitors Cs1, Cs2, and Cs3 can be different from each other according to actual needs, and are not limited herein.

According to the timing chart in FIG. 3, one clock cycle is equally divided into six periods, and clock signals of the clock signal terminals at the first to third stages CLK1 to CLK3 lag sequentially by 1/6 of one clock cycle, that is, one period behind. A signal of the input signal terminal IN is 1/6 of one clock cycle earlier than (that is, one period ahead of) the signal of the clock signal terminal at the first stage CLK1. A shift control signal of a shift control signal terminal at each stage of the shift control signal terminals S1 to S3 has a first edge and a second edge, which in the present embodiment, are a rising edge and a falling edge, respectively, and the rising edge is prior to a rising edge of a clock signal from a clock signal terminal at a same stage, and the falling edge follows the rising edge of the clock signal from the clock signal terminal at the same stage and is prior to a rising edge of a clock signal from a clock signal terminal at an immediately subsequent stage. For example, as shown in FIG. 7, a shift control signal supplied by the shift control signal terminal at the first stage S1 has a rising edge, which is prior to a rising edge of a clock signal of the clock signal terminal at the first stage CLK1, and a falling edge, which follows the rising edge of the clock signal of the clock signal terminal at the first stage CLK1 and which is prior to a rising edge of a clock signal of the clock signal terminal at the second stage CLK2. A time duration of the high level period of the S1 signal should be set to enable the clock signal to sufficiently charge a coupling node between the storage capacitor Cs1 and the first shift transistor Td1.

Prior to a period t1, there is no input signal input at the input signal terminal IN of the shift register circuit 400. In other words, the shift register 100 starts operation at the period t1. During the period t1, a signal of the input signal terminal IN changes from a low level vgl to a high level vgh to turn on the first transistor T1, so that a voltage of the pull-up node at the first stage PU1 is pulled up to a first active level, i.e., the high level vgh. Under the high level of the PU, the output transistor Ta1 is turned on, but at this time, the clock signal terminals at the first to third stages CLK1, CLK2 and CLK3 continues supplying the low levels vgl, supplying low level signals to the output signal terminals OUT1, OUT2, and OUTS. Moreover, the fourth and fifth transistors T4 and T5 are turned on under the high level of the PU1, and a signal vgl from the first constant voltage signal terminal VSS can be transmitted to the second electrode of T2 and the pull-down node PD. On the other hand, the second constant voltage signal terminal VDD supplies a high level vgh so that the second and third transistors T2 and T3 are turned on, so as to enable the supply of high level signals to the second electrode of the second transistor T2 and the pull-down Node PD. In this case, width-to-length ratios of channels of T2 and T4 and of T3 and T5 can be set so that low levels, which are transmitted to the second electrode of T2 and the pull-down node PD via T4 and T5, respectively, cause the second electrode of T2 and the pull-down node PD to be finally at low levels vgl. Further, the low level at the pull-down node PD causes the pull-down transistors Tb1, Tb2, Tb3, the shift pull-down transistors Tc1, Tc2, Tc3, and the sixth transistor T6 to be turned off. At this time, the output signal terminals at the first to third stages OUT1 to OUT3 output signals which are all low level signals.

During a period t2, the signal of the clock signal terminal at the first stage CLK1 becomes at a high level, and the signals of the clock signal terminals at the second and third stages CLK2 and CLK3 remain at the low levels. The high level of the signal of the clock signal terminal at the first stage CLK1 causes the output signal terminal at the first stage OUT1 to output a high level signal. The shift control signal terminal at the first stage S1 has started to supply a high level signal at the end of the period t1, which causes the shift transistor Td1 to be turned on, and the clock signal supplied from the clock signal terminal at the first stage CLK1 also charges a coupling node between Cs1 and Td1 of the output sub-circuit at the first stage 420-1. The high level signal of the S1 lasts for a portion of the period t2, which portion is sufficient for the high level clock signal from the clock signal terminal at the first stage CLK1 to sufficiently charge the coupling node. At this time, the voltage of the PU1 will be boosted through bootstrapping effect of the storage capacitor Cs1. According to the principle of charge conservation, a voltage boost value Vr1 of the node PU1 satisfies the following formula: vgh×C=Vr1×C, from which it can be derived that Vr1=vgh. At this time, the voltage at the node PU1 is 2vgh.

At this time, since the voltage at the coupling node of the output sub-circuit at the first stage 430-1 is charged to vgh, the pull-up node at the second stage PU2 becomes at the high level vgh. The output transistor Ta2 of the output sub-circuit at the second stage 430-2 is turned on under the high level of the PU2, and a clock signal from the clock signal terminal at the second stage CLK2 is transmitted to the output signal terminal at the second stage OUT2. However, since the clock signal terminal at the second stage CLK2 continues outputting the low level signal, the output signal terminal at the second stage OUT2 remains at the low level. The output signal terminal at the third stage OUT3 also remains at the low level.

During a period t3, the signal of the clock signal at the first stage CLK1 is at the high level, the signal of the clock signal at the second stage CLK2 becomes at a high level, and the signal of the clock signal terminal at the third stage CLK3 remains at the low level. Similarly to the period t2, the high level of the signal of the clock signal terminal at the second stage CLK2 causes the output signal terminal at the second stage OUT2 to output a high level signal. The shift control signal terminal at the second stage S2 has started to supply a high level signal at the end of the period t2, which causes the shift transistor Td2 to be turned on, and the clock signal supplied from the clock signal terminal at the second stage CLK2 also charges the node for coupling the Cs2 and Td2. The high level signal of the S2 lasts for a portion of the period t3, which portion is sufficient for the high level clock signal from the clock signal terminal at the second stage CLK2 to sufficiently charge the coupling node. At this time, the shift control signal terminal at the first stage S1 has become at a low level. Therefore, the shift transistor Td1 is turned off, and the PU2 is no longer charged. At this time, the storage capacitors Cs1 and Cs2 are connected in series. Through the bootstrapping effect of the Cs2, the voltage at the PU2 will be boosted. According to the principle of charge conservation, a voltage boost value Vr2 of the PU1 is also vgh. At this time, the voltage at the PU2 is 2vgh. Further, due to the bootstrapping effect of the Cs1, the voltage at the PU1 will be further boosted, and at this time, becomes 3vgh.

At this time, since the voltage of the coupling node of the output sub-circuit at the second stage 430-2 is charged to vgh, the pull-up node at the third stage PU3 becomes at the high level vgh. The output transistor Ta3 of the output sub-circuit at the third stage 430-3 is turned on under the high level of the PU3, and a clock signal from the clock signal terminal at the third stage CLK3 is transmitted to the output signal terminal at the third stage OUT3. However, since the clock signal terminal at the third stage CLK3 continues outputting the low level signal, the output signal terminal at the third stage OUT3 remains at the low level.

During a period t4, the signal of the clock signal at the first stage CLK1 is at the high level, the signal of the clock signal at the second stage CLK2 is at the high level, and the signal of the clock signal terminal at the third stage CLK3 becomes at a high level. Similarly to the periods t2 and t3, the high level of the signal of the clock signal terminal at the third stage CLK3 causes the output signal terminal at the third stage OUT3 to output a high level signal. The shift control signal terminal at the third stage S3 has started to supply a high level signal at the end of the period t3, which causes the shift transistor Td3 to be turned on, and the clock signal supplied from the clock signal terminal at the third stage CLK3 also charges the node coupling the Cs3 and the Td3. The high level signal of the S3 lasts for a portion of the period t4, which portion is sufficient for the high level clock signal from the clock signal terminal at the third stage CLK3 to sufficiently charge the coupling node. At this time, the signals of the shift control signal terminals at the first and second stages S1 and S2 have become at low levels. Consequently, the shift transistors Td1 and Td2 are turned off, and PU2 and PU3 are no longer charged. At this time, the storage capacitors Cs1, Cs2, and Cs3 are connected in series. Through the bootstrapping effect of the Cs3, the voltage at the PU3 will be boosted. According to the principle of charge conservation, a voltage boost value Vr3 of the PU3 is vgh. At this time, the voltage at the PU3 becomes 2vgh. Further, through the bootstrapping effect of the Cs2, the voltage at the PU2 will be boosted and at this time is boosted to 3vgh. Further, due to the bootstrapping effect of the Cs1, the voltage at the PU1 will be boosted, and at this time, becomes 4vgh. In the period t4, the output signal terminals at the first to third stages OUT1 to OUT3 output signals which are all at high levels.

During a period t5, the signal of the clock signal at the first stage CLK1 becomes at a low level, the signal of the clock signal at the second stage CLK2 is at the high level, and the signal of the clock signal terminal at the third stage CLK3 is at the high level. Since S1, S2, and S3 are all maintained at the low levels during the period t5, Cs1, Cs2, and Cs3 are connected in series, and in the case where the voltage of the coupling node of the output sub-circuit at the third stage 420-3 remains unchanged, the voltages of PU1, PU2 and PU3 remain unchanged. During the period t5, the output signal terminal at the first stage OUT1 outputs a low level signal, and the output signal terminals at the second and third stages OUT2 and OUT3 output high level signals.

During the period t5, the output level of the OUT1 drops from the high level to the low level, and its dropping speed is determined by a driving level of the output transistor Ta1, i.e., by the voltage at the PU1. However, as described above, the voltage at the PU1 remains unchanged (i.e., 4vgh) in the dropping process of the output level of the OUT1. Therefore, the output level of the OUT1 drops from the high level vgh to the low level vgl under the driving level of 4vgh.

During a period t6, the signal of the clock signal terminal at the first stage CLK1 remains at the low level, the signal of the clock signal terminal at the second stage CLK2 becomes at a low level, and the signal of the clock signal terminal at the third stage CLK3 is at the high level. Similarly to the period t5, since S1, S2, and S3 are all maintained at the low levels during t6, Cs1, Cs2, and Cs3 remain connected in series, and in the case where the voltage at the coupling node of the output sub-circuit at the third stage 420-3 remains unchanged, the voltages at the PU1, PU2, and PU3 remain unchanged. During the period t6, the output signal terminals at the first and second stages OUT1 and OUT2 output low level signals, and the output signal terminal at the third stage OUT3 outputs a high level signal.

During t6, the output level of the OUT2 drops from the high level to the low level, and its dropping speed is determined by a driving level of the output transistor Ta2, i.e., by the voltage at the PU2. However, as described above, the voltage at the PU2 remains unchanged (i.e., 3vgh) during the dropping of the output level of the OUT2. Consequently, the output level of the OUT2 drops from the high level vgh to the low level vgl under the driving voltage of 3vgh.

During a period t7, the signal of the clock signal terminal at the first terminal CLK1 remains at the low level, the signal of the clock signal terminal at the second stage CLK2 remains at the low level, and the signal of the clock signal terminal at the third stage CLK3 becomes at a low level. Similarly to the periods t5 and t6, since S1, S2, and S3 are all maintained at the low level during t7, Cs1, Cs2, and Cs3 remain connected in series, and in the case where the voltage at the coupling node of the output sub-circuit at the third stage 420-3 remains unchanged, the voltages at the PU1, PU2 and PU3 remain unchanged. During the period t7, the output signal terminals at the first to third stages OUT1 to OUT3 output signals which are all at low levels.

During the period t7, the output level of the OUT3 drops from the high level to the low level, and its dropping speed is determined by a driving level of the output transistor Ta3, i.e., by the voltage at the PU3. However, as described above, the voltage of the PU3 remains unchanged (i.e., 2vgh) in the dropping process of the output level of the OUT3. Consequently, the output level of the OUT3 drops from the high level vgh to the low level vgl under the driving voltage 2vgh.

During a period t8, the reset signal terminal RESET becomes a high level, and the seventh transistor T7 is turned on to pull the pull-up node at the first stage PU1 down to a low level, thereby realizing the resetting of the PU node. As a result, the fourth and fifth transistors T4 and T5 are turned off, causing the pull-down node PD to become at a high level in response to the signal of the VDD. Further, the pull-down transistors Tb1, Tb2, and Tb3 are all turned on, and the VSS signal is further transmitted to the output signal terminals OUT1, OUT2, and OUT3 to ensure that the outputs thereof are at low levels. The shift pull-down transistors Tc1, Tc2, and Tc3 are also turned on to reset coupling nodes between the storage capacitors and the shift transistors of the output sub-circuits at the first to third stages 420-1 to 420-3 to a low level.

As can be seen from the above, the dropping processes of the output levels of the output signal terminals OUT1, OUT2, and OUT3 from the high level vgh to the vgl are affected by the pull-up nodes at the first to third stages PU1, PU2, and PU3, respectively, and a magnitude of the driving voltage determines a dropping speed of the output level of the output signal terminal. The voltage at the PU1 during the dropping of the output level of the OUT1 is maintained at 4vgh, the voltage at the PU2 during the dropping of the output level of the OUT2 is maintained at 3vgh, and the voltage at the PU3 during the dropping of the output level of OUT3 is maintained at 2vgh. It can be seen that during the dropping of the levels of the OUT1, OUT2 and OUT3, the output transistors are sufficiently turned on (the driving voltages are not less than 2vgh), and the difference in the dropping time is greatly suppressed.

Figure 8:
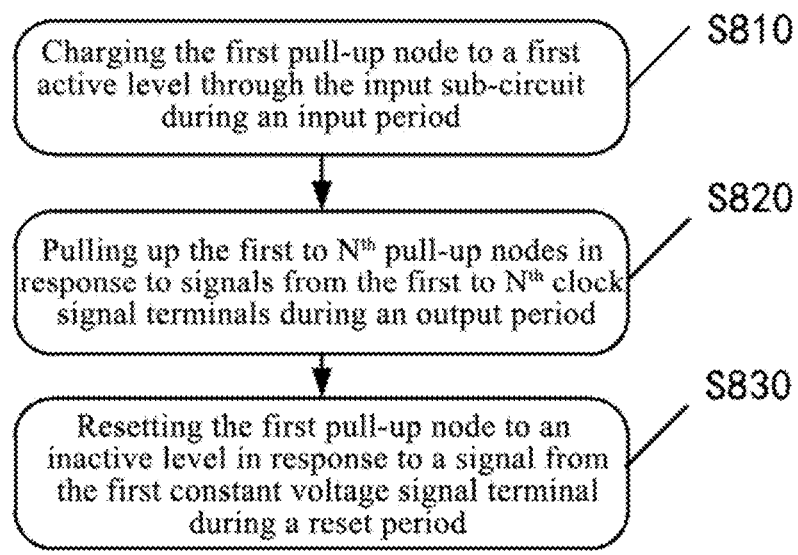
FIG. 8 shows a flow chart of a method for driving a shift register circuit according to an embodiment of the present disclosure.

FIG. 8 shows a flow chart of a method for driving a shift register circuit 800 in accordance with an embodiment of the present disclosure. The method 800 can be used to drive the shift register circuit 400 as shown in FIGS. 4 to 6.

In step S810, during an input period (e.g., the period t1), the pull-up node at the first stage (e.g., PU1) is charged to a first active level (e.g., vgh) through the input sub-circuit (e.g., input sub-circuit 410) under the control of an input control signal.

In step S820, during an output period (e.g., the periods t2 to t6), pull-up nodes at the first to $N^{th}$ stages (e.g., PU1-PUN) are pulled up in response to clock signals from clock signal terminals at first to $N^{th}$ stages (e.g., CLK1-CLKN) under the control of shift control signals from the shift control signal terminals at the first to $N^{th}$ stages (e.g., S1-SN), respectively, and clock signals from the clock signal terminals at the first to $N^{th}$ stages are outputted from output signal terminals at the first to $N^{th}$ stages, respectively. The pull-up node at the first stage PU1 is pulled up to be (N+1) times vgh, the pull-up node at the second stage PU2 is pulled up to be N times vgh, and so on.

In step S830, during a reset period (e.g., the period t8), under the control of a signal from a reset signal terminal (e.g., RESET), a signal from a first constant voltage signal terminal (e.g., VSS) will reset the pull node at the first stage (e.g., PU1) to an inactive level (e.g., vgl).

In some embodiments, a shift control signal of a shift control signal terminal at each stage of the shift control signal terminals at the first to $N^{th}$ stages has a first edge and a second edge (which in the present embodiment shown in FIG. 3, are a rising edge and a falling edge, respectively), and the first edge is prior to a first edge of a clock signal from a clock signal terminal at a same stage, and the second edge follows the first edge of the clock signal from the clock signal terminal at the same stage and is prior to a first edge of a clock signal from a clock signal terminal at an immediately subsequent stage.

Figure 9:
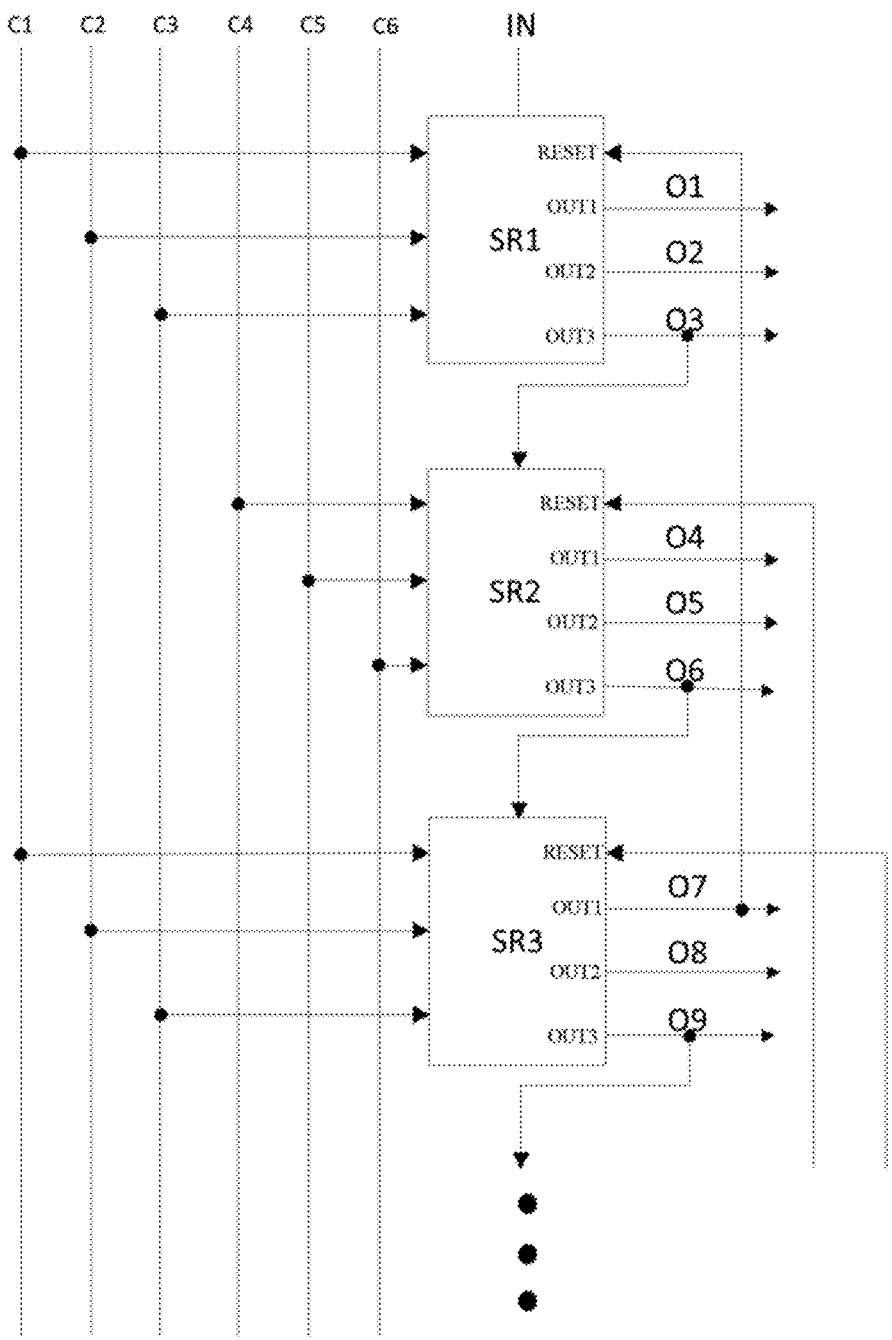
FIG. 9 shows a diagram of a cascaded structure of a gate driving circuit according to an embodiment of the present disclosure.

FIG. 9 shows a diagram of a cascaded structure of a gate driving circuit 900 in accordance with an embodiment of the present disclosure. The gate driving circuit 900 includes a plurality of cascaded shift register circuits SR1 to SRM, each of which can be implemented by the shift register circuit 400 as shown in FIGS. 4-6. The case where there are three shift register circuits 400 will be described below as an example to explain coupling relationships of the shift register circuits SR1 to SRM, that is, M is equal to 3.

The gate driving circuit 900 is coupled to 2K clock signal lines, and for convenience of illustration in FIG. 9, K equal to 3 is given as an example, that is, six clock signal lines (C1-C6) are shown in FIG. 9. The 2K clock signal lines (for example, C1-C6) are sequentially and cyclically coupled to clock signal terminals (for example, CLK1-CLK3) of a shift register circuit at each stage of the plurality of cascaded shift register circuits SR1-SRM, so as to supply a first to a corresponding one of 2K clock signals to output sub-circuits in a shift register circuit at each stage. Here, in order to realize the supply of a reset signal, N is limited to be less than or equal to K+1. For example, in the embodiment shown in FIG. 9, N is equal to 3, which is less than or equal to 4 (here, K+1=4).

Output signal terminals OUT1 to OUT3 of a shift register circuit at each stage are used to drive three gate signal lines. For example, the shift register circuit SR1 drives signal lines O1 to O3.

As shown in FIG. 9, a shift register circuit at each stage is electrically coupled to an output signal terminal selected from three output signal terminals of a shift register circuit at one subsequent stage (for example, one stage immediately subsequent to, or two stages immediately subsequent to the current stage) to make an output signal from the selected output signal terminal used as a reset signal. Generally, the selected output signal terminal is selected based on such a criterion that the output signal of the selected output signal terminal has a first edge, which is not earlier than a second edge of a clock signal of a $N^{th}$ clock signal terminal in the shift register circuit, and a second edge, which is not later than a first edge of a next cycle of a clock signal of the first clock signal terminal in the shift register circuit. By way of example, in the gate driving circuit 900 shown in FIG. 9, the timing of the shift register circuit SR1 is identical to that in FIG. 7. The reset signal terminal RESET is coupled to the first output signal terminal OUT1 of the shift register circuit SR3, that is, a signal outputted to a seventh gate drive signal line O7 is used to reset the shift register circuit SR1. As shown in FIG. 7, a first edge (i.e., a rising edge) of the signal of the reset signal terminal RESET is later than a second edge (i.e., a falling edge) of the clock signal of the third clock signal terminal CLK3 in the shift register circuit SR1, and a second edge (i.e., a falling edge) of the signal of the signal terminal RESET is synchronized with a first edge (i.e., a rising edge) of the next cycle of the first clock signal terminal CLK1 of the SR1.

In some embodiments, the first to $(2K)^{th}$ clock signals have a duty cycle of is 50%, and lag sequentially by 1/2K of one clock cycle.

In some embodiments, the input signal terminal IN of the shift register circuit at the first stage SR1 is configured to receive a frame start signal from outside. In addition, as shown in FIG. 9, an input signal terminal IN of a shift register circuit at each stage except the shift register circuit at the first stage SR1 is electrically coupled to a $N^{th}$ output signal terminal OUTN of the shift register circuit at a preceding stage, so that an output signal from the $N^{th}$ output signal terminal is used as an input signal.

Figure 10:
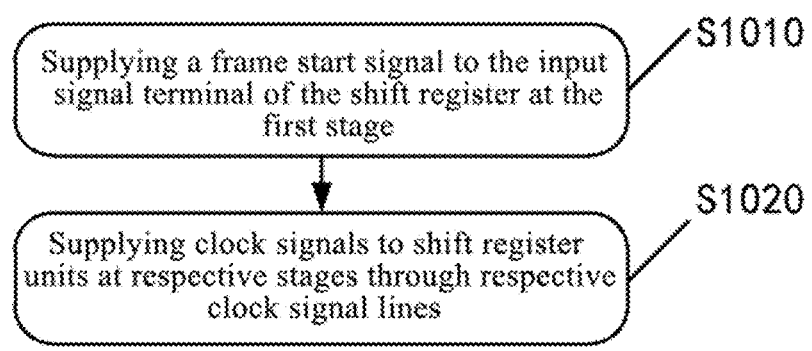
FIG. 10 shows a flow chart of a method for driving a gate driving circuit according to an embodiment of the present disclosure.

FIG. 10 shows a flow chart of a method 1000 for driving a gate driving circuit in accordance with an embodiment of the present disclosure. The method 1000 can be used to drive a gate driving circuit 900 as shown in FIG. 9.

In step S1010, a frame start signal is supplied to an input signal terminal of a shift register circuit at a first stage (e.g., SR1).

In step S1020, clock signals are supplied to clock signal terminals in shift register circuits at respective stages through 2K clock signal lines (for example, C1-C6). A clock signal supplied by a first clock signal line (i.e., C1) of the 2K clock signal lines has a first edge (e.g., a rising edge) in a first cycle, which lags by 1/2K of one clock cycle behind a first edge of the frame start signal.

Figure 11:
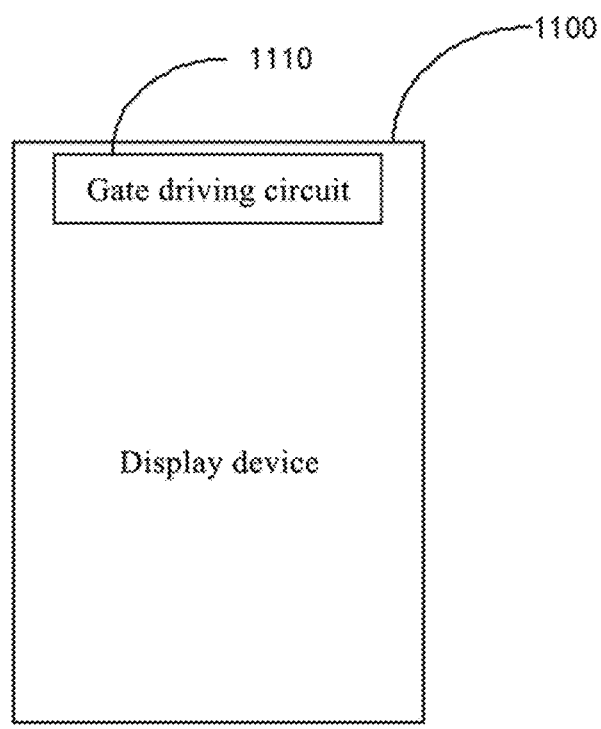
FIG. 11 shows a schematic block diagram of a display device according to an embodiment of the present disclosure.

FIG. 11 shows a schematic block diagram of a display device in accordance with an embodiment of the present disclosure. As shown in FIG. 11, the display device 1100 includes a gate driving circuit 1110. The gate driving circuit 1110 can be implemented by a gate driving circuit according to any of the embodiments of the present disclosure. The display device 1000 according to the embodiment of the present disclosure can be any product or component having a display function such as an electronic paper, a mobile phone, a tablet computer, a television, a display, a notebook computer, a digital photo frame, a navigator, or the like.

The detailed description above has set forth numerous embodiments by using the schematic diagrams, flow diagrams and/or examples. In the case that such schematic diagrams, flow diagrams and/or examples include one or more functions and/or operations, those skilled in the art will appreciate that each function and/or operation in such schematic diagrams, flow diagrams, or examples can by implemented individually and/or collectively by various structures, hardware, software, firmware or virtually any combination thereof.

The present disclosure has been described with reference to a few representative embodiments, and it is understood that the terms used herein are illustrative and exemplary and not restrictive. The present disclosure can be embodied in a variety of forms without departing from the spirit or scope of the disclosure. It is to be understood that the above-described embodiments are not limited to the details as described above, but are to be construed broadly within the spirit and scope defined by the appended claims. All changes and modifications that fall within the scope of the claims or the equivalents thereof are intended to be covered by the appended claims.

What is claimed is:

1. A shift register circuit, comprising:
    an input sub-circuit, electrically coupled to an input signal terminal and a pull-up node at a first stage, and configured to transmit an input signal from the input signal terminal to the pull-up node at the first stage;
    output sub-circuits at first to $N^{th}$ stages, of which an output sub-circuit at each stage is electrically coupled to a clock signal terminal at a corresponding stage of clock signal terminals at first to $N^{th}$ stages, to a pull-up node at a corresponding stage of pull-up nodes at the first to $N^{th}$ stages, to an output signal terminal at a corresponding stage of output signal terminals at first to $N^{th}$ stages, and to a shift control signal terminal at a corresponding stage of shift control signal terminals at first to $N^{th}$ stages, an output sub-circuit at each stage of the output sub-circuits at the first to $(N-1)^{th}$ stages being electrically coupled to a pull-up node at an immediately subsequent stage, where N is an integer greater than 1,
    wherein an output sub-circuit at each stage of the output sub-circuits at the first to $N^{th}$ stages is configured to transmit a clock signal from a clock signal terminal at a same stage to an output signal terminal at the same stage under the control of the pull-up node at the same stage, and
    the output sub-circuit at each stage of the output sub-circuits at the first to $(N-1)^{th}$ stages is further configured to, under a shift control signal from a shift control signal terminal at the same stage, transmit a signal from the output signal terminal at the same stage to a pull-up node at an immediately subsequent stage.

2. The shift register circuit according to claim 1, further comprising:
    pull-down sub-circuits at first to $N^{th}$ stages, electrically coupled in a one-to-one correspondence to the output sub-circuits at the first to $N^{th}$ stages;
    wherein a pull-down sub-circuit at each stage of the pull-down sub-circuits at the first to $N^{th}$ stages is electrically coupled to a pull-down node, a first constant voltage signal terminal and an output signal terminal at a same stage, and configured to transmit a signal from the first constant voltage signal terminal to a signal output terminal at the same stage and an output sub-circuit at the same stage under the control of the pull-down node.

3. The shift register circuit according to claim 2, further comprising:
    a control sub-circuit, electrically coupled to the first constant voltage signal terminal, a second constant voltage signal terminal, the pull-up node at the first stage, and the pull-down node,
    wherein the control sub-circuit is configured to transmit a signal from the first constant voltage signal terminal or from the second constant voltage signal terminal to the pull-down node under the control of the pull-up node at the first stage.

4. The shift register circuit according to claim 3, further comprising:
    a reset sub-circuit, electrically coupled to a reset signal terminal, the first constant voltage signal terminal, and the pull-up node at the first stage,
    wherein the reset sub-circuit is configured to transmit, under the control of a signal from the reset signal terminal, a signal from the first constant voltage signal terminal to the pull-up node at the first stage to reset the pull-up node at the first stage.

5. The shift register circuit according to claim 1, wherein an output sub-circuit at each stage comprises an output transistor, a shift transistor, and a storage capacitor,
    wherein a control electrode of the output transistor is electrically coupled to a pull-up node at a same stage, a first electrode of the output transistor is electrically coupled to a clock signal terminal at the same stage, and a second electrode of the output transistor is electrically coupled to an output signal terminal at the same stage;
    wherein a control electrode of the shift transistor is electrically coupled to a shift control signal terminal at the same stage, a first electrode of the shift transistor is electrically coupled to an output signal terminal at the same stage, and a second electrode of the shift transistor is electrically coupled to a pull-up node at an immediately subsequent stage; and
    wherein a first electrode of the storage capacitor is electrically coupled to a pull-up node at the same stage, and a second electrode of the storage capacitor is electrically coupled to a shift output signal terminal at the same stage.

6. The shift register circuit according to claim 2, wherein a pull-down sub-circuit at each stage comprises a pull-down transistor and a shift pull-down transistor,
    wherein a control electrode of the pull-down transistor is electrically coupled to the pull-down node, a first electrode of the pull-down transistor is electrically coupled to the first constant voltage signal terminal, and a second electrode of the pull-down transistor is electrically coupled to an output signal terminal at a same stage; and
    wherein a control electrode of the shift pull-down transistor is electrically coupled to the pull-down node, a first electrode of the shift pull-down transistor is electrically coupled to the first constant voltage signal terminal, and a second electrode of the shift pull-down transistor is electrically coupled to an output sub-circuit at the same stage.

7. The shift register circuit according to claim 1, wherein the input sub-circuit comprises a first transistor, wherein a control electrode and a first electrode of the first transistor is electrically coupled to the input signal terminal, and a second electrode of the first transistor is electrically coupled to the pull-up node at the first stage.

8. The shift register circuit according to claim 3, wherein the control sub-circuit comprises a second transistor, a third transistor, a fourth transistor, and a fifth transistor,
    wherein a control electrode and a first electrode of the second transistor are electrically coupled to the second constant voltage signal terminal, and a second electrode of the second transistor is electrically coupled to a control electrode of the third transistor;
    wherein a first electrode of the third transistor is electrically coupled to the second constant voltage signal terminal, and a second electrode of the third transistor is electrically coupled to the pull-down node;
    wherein a control electrode of the fourth transistor is electrically coupled to the pull-up node at the first stage, a first electrode of the fourth transistor is electrically coupled to the first constant voltage signal terminal, and a second electrode of the fourth transistor is electrically coupled to the control electrode of the third transistor; and wherein a control electrode of the fifth transistor is electrically coupled to the pull-up node at the first stage, a first electrode of the fifth transistor is electrically coupled to the first constant voltage signal terminal, and a second electrode of the fifth transistor is electrically coupled to the pull down node.

9. The shift register circuit according to claim 8, wherein the control sub-circuit further comprises a sixth transistor, wherein
a control electrode of the sixth transistor is electrically coupled to the pull-down node, a first electrode of the sixth transistor is electrically coupled to the first constant voltage signal terminal, and a second electrode of the sixth transistor is electrically coupled to the pull-up node at the first stage.

10. The shift register circuit according to claim 4, wherein the reset sub-circuit comprises a seventh transistor, wherein
a control electrode of the seventh transistor is electrically coupled to the reset signal terminal, a first electrode of the seventh transistor is electrically coupled to the first constant voltage signal terminal, and a second electrode of the seventh transistor is electrically coupled to the pull-up node at the first stage.

11. A method for driving a shift register circuit according to claim 1, comprising:
during an input period, charging the pull-up node at the first stage to a first active level through the input sub-circuit;
during an output period, pulling up pull-up nodes at the first to $N^{th}$ stages in response to clock signals from the clock signal terminals at the first to $N^{th}$ stages under the control of shift control signals from the shift control signal terminals at the first to $N^{th}$ stages, respectively, and outputting, from the output signal terminals at the first to $N^{th}$ stages, clock signals from the clock signal terminals at the first to $N^{th}$ stages, respectively; and
during a reset period, resetting the pull-up node at the first stage to an inactive level in response to a signal from a first constant voltage signal terminal under the control of a signal from a reset signal terminal.

12. The method according to claim 11, wherein a shift control signal from the shift control terminal at each stage of the shift control signal terminals at the first to $N^{th}$ stages has a first edge, which is prior to a first edge of a clock signal from a clock signal terminal at a same stage, and a second edge, which follows the first edge of the clock signal from the clock signal terminal at the same stage and is prior to a first edge of a clock signal from a clock signal terminal at an immediately subsequent stage.

13. A gate driving circuit, comprising a plurality of cascaded shift register circuits, each of the shift register circuits being a shift register circuit as claimed in claim 1, wherein the gate driving circuit is coupled to 2K clock signal lines, which are sequentially and cyclically coupled to clock signal terminals of a shift register circuit at each stage of the plurality of cascaded shift register circuits to supply a first to a corresponding one of 2K clock signals to output sub-circuits in a shift register circuit at each stage, where K is a positive integer and N is less than or equal to K+1, and
wherein a shift register circuit at each stage is electrically coupled to an output signal terminal selected from N output signal terminals of a shift register circuit at one subsequent stage to make an output signal from the selected output signal terminal used as a reset signal.

14. The gate driving circuit according to claim 13, wherein the selected output signal terminal is selected based on a criterion that the output signal of the selected output signal terminal has a first edge, which is not earlier than a second edge of a clock signal of a $N^{th}$ clock signal terminal in the shift register circuit, and a second edge, which is not later than a first edge of a next cycle of a clock signal of the first clock signal terminal in the shift register circuit.

15. The gate driving circuit according to claim 13, wherein
the input signal terminal of the shift register circuit at the first stage is configured to receive a frame start signal from outside, and
an input signal terminal of a shift register circuit at each stage except for the first stage is electrically coupled to a $N^{th}$ output signal terminal of a shift register circuit at a preceding stage to make an output signal outputted from the $N^{th}$ output signal terminal as an input signal.

16. The gate driving circuit according to claim 13, wherein the gate driving circuit is a Gate Driver On Array (GOA) circuit.

17. A method for driving a gate driving circuit as claimed in claim 13, comprising:
supplying a frame start signal to the input signal terminal of a shift register circuit at a first stage; and
supplying clock signals to clock signal terminals in shift register circuits at respective stages through the 2K clock signal lines, wherein a clock signal supplied by a first clock signal line of the 2K clock signal lines has a first edge in a first cycle, which lags by 1/2K of one clock cycle behind a first edge of the frame start signal.

18. The method according to claim 17, wherein the first to $(2K)^{th}$ clock signals have a duty cycle of 50%, and lag sequentially by 1/2K of one clock cycle.

19. A display device, comprising a gate driving circuit as claimed in claim 13.

20. The display device according to claim 19, wherein the gate driving circuit is a Gate Driver On Array (GOA) circuit.

* * * * *